(12) United States Patent
Berard

(10) Patent No.: US 9,887,579 B2
(45) Date of Patent: Feb. 6, 2018

(54) POWER CONVERTER WITH DIGITAL CURRENT CONTROL CIRCUIT

(75) Inventor: Olivier Berard, Voreppe (FR)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 781 days.

(21) Appl. No.: 14/370,823

(22) PCT Filed: Jan. 5, 2012

(86) PCT No.: PCT/IB2012/000163
§ 371 (c)(1),
(2), (4) Date: Nov. 5, 2014

(87) PCT Pub. No.: WO2013/102780
PCT Pub. Date: Jul. 11, 2013

(65) Prior Publication Data
US 2015/0076913 A1    Mar. 19, 2015

(51) Int. Cl.
| | |
|---|---|
| *H02J 9/06* | (2006.01) |
| *H02J 9/02* | (2006.01) |
| *H03K 17/00* | (2006.01) |
| *H02M 1/00* | (2006.01) |
| *H02M 7/44* | (2006.01) |

(52) U.S. Cl.
CPC ............... *H02J 9/062* (2013.01); *H02J 9/02* (2013.01); *H02M 1/00* (2013.01); *H02M 7/44* (2013.01); *H03K 17/00* (2013.01); *H02M 2001/0009* (2013.01); *H02M 2001/0012* (2013.01); *Y10T 307/615* (2015.04)

(58) Field of Classification Search
CPC ................................. H02H 9/02; H03H 17/00
USPC .......................................................... 307/131
See application file for complete search history.

(56) References Cited

U.S. PATENT DOCUMENTS

| | | | | |
|---|---|---|---|---|
| 5,068,775 | A * | 11/1991 | Borgatti ................. | H02M 3/28 363/15 |
| 6,215,288 | B1 * | 4/2001 | Ramsey ............. | H02M 3/1588 323/224 |
| 7,719,248 | B1 * | 5/2010 | Melanson ........... | H02M 1/4225 323/222 |
| 7,843,178 | B1 * | 11/2010 | Houk ..................... | H02M 1/36 323/222 |
| 2004/0189251 | A1 | 9/2004 | Kutkut et al. | |
| 2005/0036245 | A1 * | 2/2005 | Greenfeld ........... | H02M 3/3376 361/18 |
| 2006/0043943 | A1 * | 3/2006 | Huang ................ | H02M 3/1584 323/222 |
| 2006/0113975 | A1 * | 6/2006 | Mednik ............... | H02M 1/4208 323/282 |

(Continued)

OTHER PUBLICATIONS

Dodge, et al. "IGBT tutorial: Part 1—Selection" EE Times. Mar. 8, 2007. http://www.eetimes.com/document.asp?doc_id=1273173.

(Continued)

*Primary Examiner* — Adi Amrany
(74) *Attorney, Agent, or Firm* — Lando & Anastasi, LLP

(57) ABSTRACT

A current control circuit (208) for a power converter (200) to control the switching thereof, wherein the current control circuit comprises a digital controller (210) using a logical input signal (226) to produce a logical control signal (212) with a fixed fundamental frequency for the power converter.

21 Claims, 3 Drawing Sheets

(56) References Cited

U.S. PATENT DOCUMENTS

| | | | |
|---|---|---|---|
| 2006/0125454 A1* | 6/2006 | Chen | H02M 3/1588 323/282 |
| 2006/0232226 A1* | 10/2006 | Ortiz | H02M 1/4225 315/291 |
| 2011/0095732 A1* | 4/2011 | Park | G05F 1/70 323/207 |
| 2012/0075893 A1* | 3/2012 | Higuchi | H02M 1/32 363/37 |
| 2012/0119720 A1* | 5/2012 | Li | H02M 3/158 323/284 |
| 2012/0300515 A1* | 11/2012 | Carletti | H02M 1/4225 363/74 |
| 2013/0082611 A1* | 4/2013 | Cohen | H05B 33/0815 315/185 R |

OTHER PUBLICATIONS

International Search Report and Written Opinion dated Jan. 11, 2013 for PCT/IB2012/000163.

Maksimovic D et al: Impact of digital control in power electronics, Power Semiconductor Devices and ICS, 2004. Proceedings. ISPSD '04. The 16th International Symposium on Kitakyushu Int. Conf. CTR, Japan May 24-27, 2004, Piscataway, NJ, USA, IEEE, May 24, 2004 (May 24, 2004), pp. 13-22.

Peng H et al: "Digital current-mode controller for DC-DC converters", Applied Power Electronics Conference and Exposition 2005. APEC 2005. Twentieth Annual IEEE Austin, TX, USA Mar. 6-19, 2005, Piscataway, NJ, USA, IEEE, US, vol. 2, Mar. 6, 2905 (2905-93-06), pp. 899-905.

"STCF03 High power white LED driver with I2C Interface", STMicroelectronics Datasheet, Feb. 1, 2011 (Feb. 1, 2011), XP002689404, Retrieved from the Internet: URL:http://www.st.corntinternet/com/TECHNICAL_RESOURCES/TECHNICAL_LITERATURE/DATASHEET/CD00150946.pdf [retrieved on Dec. 17, 2012].

"Intelligent power supply design solutions Brochure", Microchip ,2011, p. 1-16, XP002689405, Retrieved from the Internet: URL:http://ww1.microchip.com/downloads/en/DeviceDoc/01240e.pdf [retrieved on Dec. 17, 2912].

Pereira, et al. "A Simple Full Digital Adaptive Current Hysteresis Control with Constant Modulation Frequency for Active Power Filters." IEEE, 2007, p. 1644-1648.

Zeng, et al. "A Novel Hysteresis Current Controller for Active Power Filter With Constant Switching Frequency." IEEE, p. 692-697.

Chun, et al. "Development of Adaptive Hysteresis Band Current Control Strategy of PWM Inverter with Constant Switching Frequency." IEEE, 1996, p. 194-199.

Ho, et al. "Constant-Frequency Hysteresis Current Control of Grid-Connected VSI without Bandwidth Control." IEEE, 2009, p. 2949-2956.

Martin, et al. "New Fixed Frequency AC Current Controller for a Single Phase Voltage Source Inverter." IEEE, 2002, p. 909-914.

\* cited by examiner

POWER CONVERTER WITH DIGITAL CURRENT CONTROL CIRCUIT

FIELD OF THE INVENTION

The present invention relates to a control system and method for a power converter such as an uninterruptible power supply (UPS).

BACKGROUND OF THE INVENTION

An uninterruptible power supply (UPS) may be used to provide emergency power in situations where the main power supply fails or performs in an unusual manner. The UPS is designed to switchover in a near instantaneous or instantaneous fashion, due to the nature of the batteries used and the circuitry of the UPS. A UPS can be used to deal with a number of unusual events occurring at the mains power supply, such as: power failure; surge; sag; spikes in the power supply; noise; frequency instability; harmonic distortion; etc.

A UPS can be used to protect any type of equipment, however generally a UPS is most often found in computers, data centres, telecommunication systems and any other electrical equipment which could cause serious consequences such as damage to the person or to a business interest if there were no power.

A UPS can take many different forms and relate to various different technologies. The most common general categories of UPS are online, line interactive, and standby. Each of these is well-known in the art as are the other alternatives such as hybrid topologies and ferro-resistant technologies.

A UPS includes three main power converters. A DC to AC converter is used to supply the load with a clean AC voltage. That DC to AC converter is called an inverter and could be supplied by two different input sources. Firstly, the inverter could be supplied by an AC to DC converter used to convert an AC input source voltage into a DC voltage, which in turn is used to supply an output DC to AC converter. Secondly, a bi-directional DC to DC converter could be used in any circumstance where there is a failure in the input AC source to thus supply the DC to AC converter from the batteries.

The three power converters in a UPS are controlled by a control board in order to reach objectives defined for the UPS. One such objective may be summarised as: supplying an output customer load with a high quality voltage, whatever the state of the input AC voltage source, in a secure and safe manner. To achieve these objectives, certain physical signals need to be controlled using regulation algorithms or the like. On each converter, output voltage and driven current are regulated. Generally, all regulation algorithms used to control output voltage and driven currents in a UPS are embedded in the same control board.

One problem with using the same control board is that the control board has to be re-designed for any new UPS requirements (power topology, product architecture, etc.). This problem occurs each time there is a new project. The re-use of control boards from older products is difficult due to a high level of reliability expected for the control and UPS specific requirements.

In order to design a new product in which controls can be re-usable in future products, regulations or control functions have been classified into two categories. The first category contains regulations common to all UPS product requirements; the second category contains regulations specific to each new UPS product requirement.

In order to improve future re-use of control, the two categories of regulation or control function have to be embedded in two different circuit boards. The first is a common re-usable circuit board containing first category regulation (common to all UPSs) and the second is a specific circuit board containing second category regulation (specific to one particular UPS), which will be re-designed for each new product.

Generally, the specific circuit boards are of an on-chip design since the number of manufactured units will be low and may only be relevant to one product.

The common re-usable circuit board will contain all the common regulations and complex algorithms. As the manufactured number will be high, the cost optimisation will be a lower priority than is the case for the specific board.

The present invention provides a way of implementing current regulation in a cost effective manner in a specific control circuit board.

A number of proposals have been tried in the past in order to address the problem. One proposal relates to a fixed frequency linear analogue current controller, however this has been found to be difficult to tune, with a limited reliability and flexibility. Another proposal relates to a fixed frequency linear digital current controller. This requires expensive and fast A to D converters which have limited dynamic range. As a result, the solution is expensive and has reduced performance. A third proposal relates to a variable frequency sliding mode controller, with or without a variable hysteresis band. This is not suitable for situations where fixed switching frequencies are demanded. A fourth proposal relates to a fixed frequency peak current controller. However, this gives rise to dynamic error and requires a complex analogue implementation to deal with all the compensation requirements.

Generally, current controllers can be classified into two main types, these are linear and non-linear.

Linear current controllers compare a current reference with a current measure and compute an error. A linear function, usually comprising gain or integration, is applied to the error and the result of the linear function is provided to a control board to control the current. A binary command signal is generated by the control board to control the output current of an inverter and thereby controls a supply current. The command signal has a pulse width that is altered to control the inverter, but is set to 0 at a regular period and is therefore considered a "fixed frequency".

Non-linear controllers determine the current error in the same way and switch a command control signal between 1 and 0 if the error exceeds certain boundary conditions. If the error is greater than an upper threshold then the command is set to reduce the current, and if the error is less than a lower threshold then the command is set to increase the current. In this case the command signal is considered to be of "variable frequency" as it is switched based only on the threshold values and without any timing considerations.

As previously mentioned, hybrid controllers also exist, which use non-linear control with a fixed frequency command. In this case there are two constraints on the command: staying within the error thresholds and the period of the command. An algorithm used in the control board considers the two constraints and decides whether to switch the command signal.

The above mentioned controllers are useful in many situations, but they do not address all the problems of the prior art.

OBJECTS OF THE INVENTION

It is an object of the present invention to overcome at least some of the problems associated with the prior art.

It is a further object of the present invention to provide a current control system for a UPS using a digital controller, such as an FPGA.

SUMMARY OF THE INVENTION

The present invention provides a method and system as set out in the accompanying claims.

According to one aspect of the present invention there is provided a current control circuit for a power converter to control the switching thereof, wherein the current control circuit comprises a digital controller using a logical input signal to produce a logical control signal with a fixed fundamental frequency for the power converter.

Optionally, the circuit further comprises a current measurement device for measuring the current in the power converter (Imes), which current is compared with a current reference (Iref) to determine a current error value (Ierr), which current error value causes the generation of the logical control signal from the digital controller.

Optionally, the current error value is transformed into the logical input signal to cause the generation of the logical control signal by the digital controller.

Optionally, the circuit further comprises a digital to analogue converter or a pulse width modulated interface to convert a digital current reference to the current reference (Iref).

Optionally, the digital current reference is produced internally in the digital controller, or comes from an external source.

Optionally, the current values of the current in the power converter (Imes), the current reference (Iref) and the current error value (Ierr) are analogue values.

Optionally, the power converter is adapted to receive the logical control signal and respond thereto by closing or opening one or more switches therein.

Optionally, the digital controller is arranged to generate said logical control signal with a timing calculated from the timing of previous transitions of said logical input signal.

Optionally, the digital controller is a digital component such as a field programmable gate array or a microprocessor.

Optionally, the circuit is for use in power converter control, to control the switching thereof.

Optionally, the circuit is adapted to control power converter specific functions.

Optionally, the circuit is for use in conjunction with a further current control circuit which is adapted to control common functions for the power converter.

The invention further relates to a power converter having a current control circuit as defined in the claims.

Optionally, the power converter forms part of an uninterruptible power supply unit.

According to a second aspect of the present invention there is provided a method of controlling the switching of a power converter comprising:
- measuring the current in the power converter to determine a measured current (Imes);
- comparing the measured current with a reference current (Iref) to determine a logical current error signal;
- using the logical current error signal to cause a logical control signal with a fixed fundamental frequency to be generated from a digital controller to thereby control the switching of the power converter.

Optionally, the method further comprises transforming the logical current error signal into a logical value to cause the generation of the logical control signal by the digital controller.

Optionally, the method further comprises transforming the logical current error signal using a comparator.

Optionally, the method further comprises converting a digital reference current to analogue to generate the reference current.

Optionally, the method further comprises generating the logical control signal for the power converter to open and close one or more switches therein.

Optionally, the logical control signal is generated with a timing calculated from the timing of previous transitions of said logical input signal.

Optionally, the digital controller is a digital component such as a field programmable gate array or a microprocessor.

The invention provides a reduced analogue interface limiting the environmental sensitivity of the UPS. The digital (FPGA)-based control circuit provides flexibility and a digital current reference transmission.

There is no need to use an analogue to digital converter; thereby allowing cost-effective compact solutions that otherwise would not have been available. The fixed switching frequency with local control of the carrier phase in the FPGA offers further advantages. The design and architecture is robust to environmental variations and offers good dynamic and static performances.

By maintaining a majority of the functions in the analogue domain and using simple digital components such as zero crossing devices and FPGAs, the current control circuit in accordance with the present invention is relatively inexpensive to produce.

In circumstances where different circuits are used for controlling different control functions, the cost issue is a further advantage. The control circuit defined in the claims is useful for controlling power converter specific functions where cost must be optimised due to the relatively small numbers that are manufactured.

BRIEF DESCRIPTION OF THE DRAWINGS

Reference will now be made, by way of example, to the accompanying drawings, in which.

DETAILED DESCRIPTION OF THE PREFERRED EMBODIMENTS

The purpose of this invention is to deliver new ways of controlling driven current in the converters of a UPS or other power converter or power application.

The present invention proposes a non-linear fixed frequency current controller based on a digital controller, such as an FPGA for switching power electronic converter control. This does not suffer from the problems of the prior art proposals in a number of manners. Firstly, there is a low-cost control implementation and the number of components required to implement the solution is considerably reduced. Secondly, high static and dynamic control performances are achieved in a fixed frequency controller. The invention will now be described in greater detail below.

Figure 1:
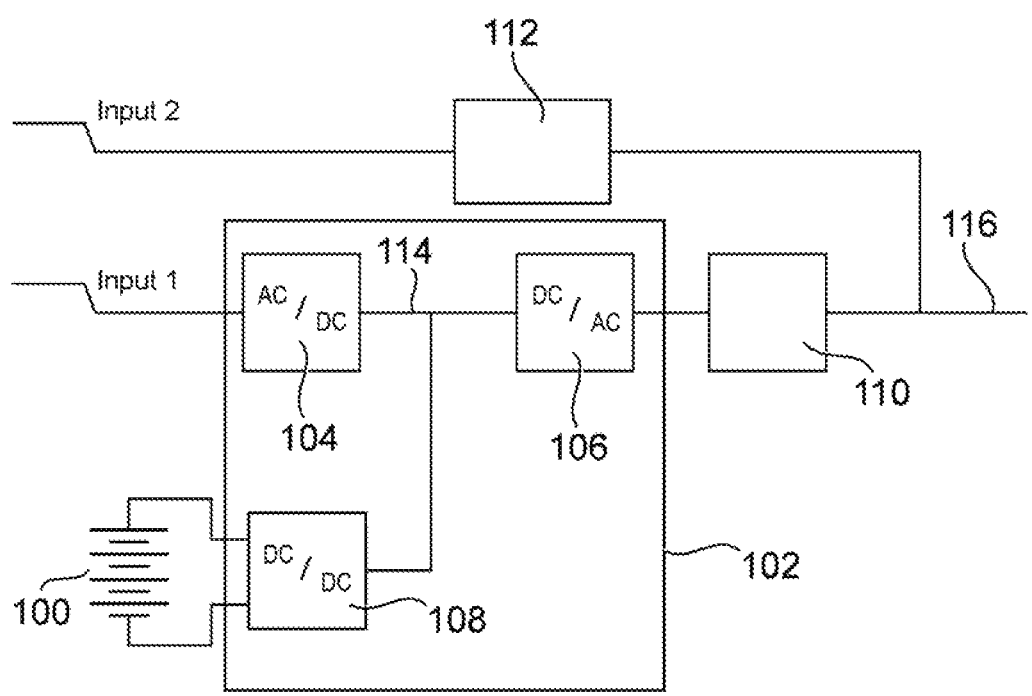
FIG. 1 is a block diagram of a UPS topology, in accordance with an embodiment of the invention.

A typical architecture of a UPS is shown in FIG. 1. FIG. 1 shows the batteries 100 and the UPS circuitry 102. The UPS circuitry includes three converters: an AC to DC PFC (power factor correction) converter 104, a DC to AC inverter 106 and a DC to DC converter 108 connected to the batteries 100. FIG. 1 also shows input 1 which passes through the PFC converter, the inverter and an interrupter 110. A second input 2 passes through an interrupter 112. The converter receives charge through a bus 114. The energy to charge the batteries is taken from the DC bus which means that available power is limited, especially for low voltage inputs. Customers may have to wait several hours for the batteries to be fully re-charged. The typical architecture shown in FIG. 1 also shows a second input (input 2) which can pass through interrupter 112 to output 116. As a result, the classic architecture shown in FIG. 1 has three different sources of energy, the first and second (input 1 and input 2) which may be a common input. The path which is used is determined by the switching of inverters 110 and 112, as will be described below. The third source of power is the batteries in the UPS.

In a first situation, input 1 passes through the PFC converter, the inverter, and interrupter 110 to the output 116. If either the PFC converter or the inverter ceases to operate, the interrupter 110 closes a switch which causes input 2 to be passed to the output 116. If both input 1 and input 2 fail, the third source of energy, the batteries, is used and the power passes through the DC to DC converter, the inverter and the interrupter 110 to output 116. The first and second power sources (input 1 and input 2) can be a common power supply.

Figure 2:
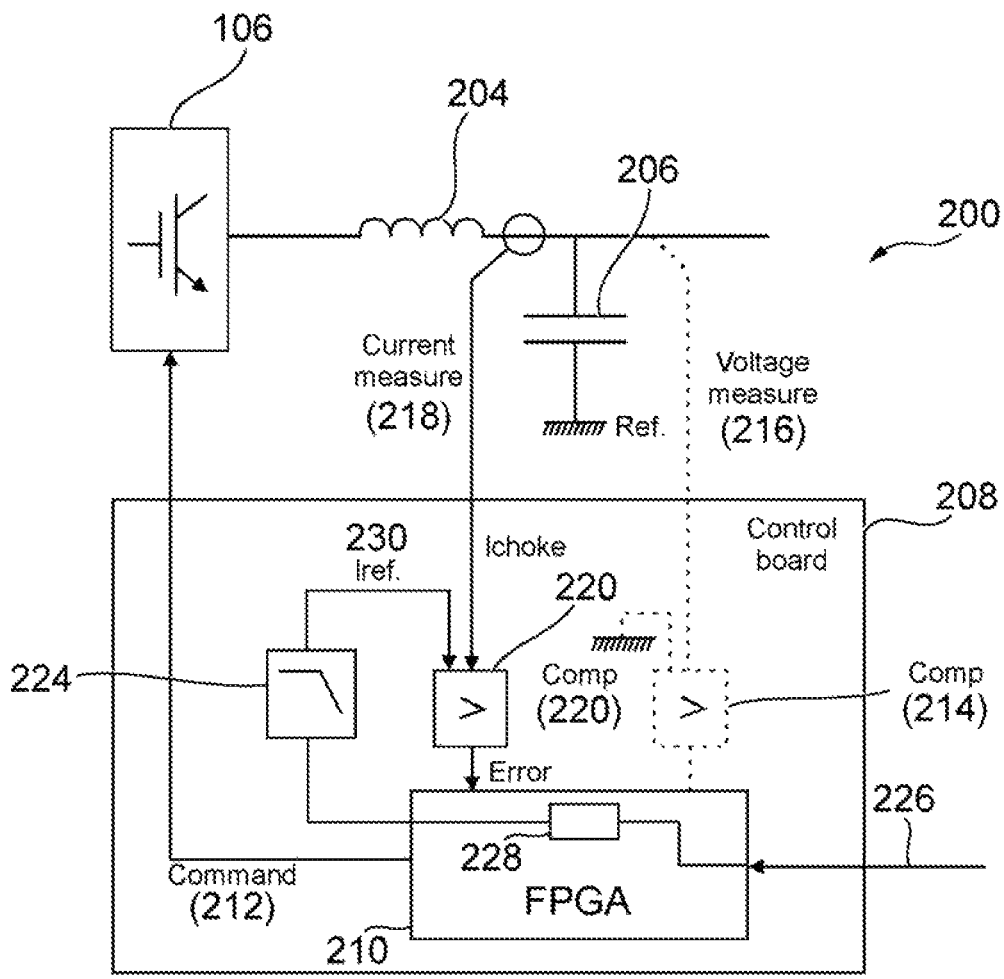
FIG. 2 is a circuit diagram of a power inverter topology, in accordance with an embodiment of the invention.

FIG. 2 shows an example of an inverter and current control system 200 according to the present invention. The system 200 is connected to the inverter 106 which is connected in series with a current measurement device, such as a choke 204. A capacitor 206 is also connected to the choke so that the current passing through the choke and the voltage across the capacitor 206 can be measured.

The circuit also includes a current control circuit 208 which deals with the specific UPS requirements. The current control circuit 208 includes a digital controller in the form of a digital component, such as a field programmable gate array (FPGA) 210, which passes command signals 212 to the inverter. The FPGA is also connected across the capacitor on one side by means of a zero cross detector (ZCD) also referred to as a comparator to 0 voltage reference (first comparator) 214 on a first line 216. The first line 216 is connected to the right-hand side of the capacitor and measures the voltage for the three main converters. A second line 218 on the left-hand side of the capacitor measures current and includes a second comparator device 220. The second comparator device is connected to a filter 224 which is also connected to the FPGA. A digital current reference 226 is introduced into the FPGA from a voltage control loop (not shown) or could be generated inside the FPGA in some cases. The digital current reference 226 (Irefd) passes through a digital analogue converter 228 in the FPGA before passing through the filter to act as an analogue reference 230 (Iref) for the second comparator device 220.

The digital current reference is usually produced in a UPS by a voltage control circuit (not shown). Where a multiple current circuit control architecture is being used, the digital current reference could come from a further current control circuit such as a re-usable circuit (not shown). The re-usable circuit may deal with the so called re-usable or common control functions which are common for all UPS systems and the circuit shown in FIG. 2 may deal with the specific control functions for the UPS or power converter in question. If the circuit of the present invention is the sole control circuit, the digital current reference will come from a different source or could be generated locally in the FPGA.

The FPGA receives a current reference (Irefd) which is either digital or pulse width modulated from a source, such as the re-usable control circuit board mentioned above. The FPGA converts the Irefd into a local onboard analogue reference (Iref) using the digital to analogue converter. Instead of the digital to analogue converter, this function may be performed by a combination of a pulse width modulator and a filter. The current (Imes) is measured on the left-hand side of the capacitor and passed to the second comparator device. The reference current (Irefd) is obtained from the voltage control loop as previously described and is passed through the digital to analogue converter 228 and the filter 224 to produce Iref where it is compared with the current measurement (Imes) at the second comparator device 220. This enables identification of any current error (Ierr). The error signal is a logical signal. The FPGA uses the logical signal and an internal clock to generate appropriate commands for the inverter and in so doing is able to follow the current reference (Iref) without any static error.

The objective of the regulation of the current is to generate appropriate commands for the inverter or other power converter to drive the real choke current (also know as Ichoke or Imes) to be equal to the analogue current reference (Iref). If the regulation is perfect, the remaining error is null or negligible. If this state is maintained for a specific time it is referred to as a static condition. If the error is large, the regulation has not worked correctly and the appropriate commands may be updated.

The commands generated by the FPGA for the inverter are logical commands (1 or 0), asking the inverter switches (IGBTs) to be closed or opened. The number of generated commands depends on the power converter topology and the number of switches.

The voltage measure is required to optimize the current regulation in some power converter topology controls, where the voltage sign is required. This is the case with topologies referred to as three level power topologies.

Figure 3:
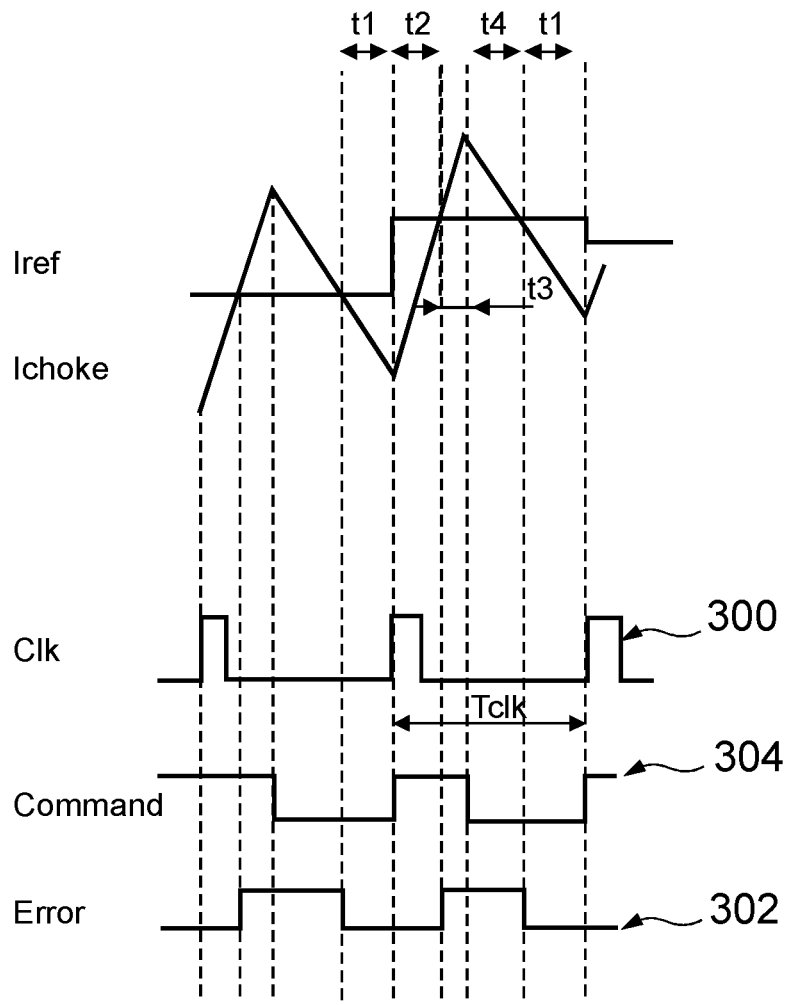
FIG. 3 is a graph showing the current cycles of the FIG. 2 topology, in accordance with an embodiment of the invention.

Referring now to FIG. 3, a graph of current against time for Imes and Iref is shown. The x-axis is the time axis and the y-axis is the current measurement axis. The FPGA has an internal clock signal (Tclk) 300 which is at a fixed fundamental frequency. The variation in Imes (also known as Ichoke) is shown. This is the current passing through the choke in the circuit of FIG. 2. The graph also shows the variation in a logical error signal 302 and the command signal 304.

At a first step, the FPGA internal clock rising edge activates a switch command at t=0. An internal counter captures the value to determine the value of t1. The counter can then be reset and the analogue reference is updated.

At a second step, when the current increases and crosses Iref at t2, the error current (Ierr) becomes negative and a zero cross signal falling edge appears. The internal counter value is measured and thus defines the value of t2, which is then stored. The time t3 is then computed from the values of t1 and t2 with a crossing factor (CF) which is a function of t3 and t4 from a previous cycle. The crossing factor and the manner in which time t3 is calculated, using an algorithm, are described below.

At a third step, when the counter reaches a value corresponding to t2 plus t3 the command signal to the inverter is deactivated and the current starts to decrease again.

At a fourth step, when the current crosses the reference current (Iref), the counter value is captured to define a value for t4 which is also saved in an appropriate location. The crossing factor (CF) is calculated using the saved values of t2, t3, and t4.

At a fifth step, the next clock rising edge of the FPGA internal clock will cause the process to return to the start of the first step.

As previously mentioned, CF and t3 are calculated by a core of the control algorithm. In order to limit the static error and so obtain a choke current (Ichoke or Imes) centred on Iref on the falling slope, it is necessary to arrive at a situation where t4=t1. From that situation, the equations for CF and t3 can be defined. In order to achieve this, CF is defined as t3/t4. CF gives the ratio between crossing and falling slopes of the current and is calculated in step four. By using the value of CF at t2, it is possible to define t3 as follows:

$$t3 = \frac{CF}{CF+2}(Tclk - t2)$$

Once the crossing factor has been calculated, it is used by the FPGA to determine the appropriate control signal for controlling the inverter. As a result, the FPGA controls the supply current of the UPS. The control of the converter in this respect relates to the current control functions provided by the present invention. Other current control functions may be carried out by different current controllers depending on whether the functions are common for all UPS systems or specific to one UPS.

The current control circuit 208 of the present invention is a part of the overall current control system 200. The overall current control circuit may include a further part: the re-usable common current control circuit (not shown).

The current control system and/or the current control circuit of the present invention may be used in any power conversion application or any power conversion product.

It will be appreciated that this invention may be varied in many different ways and still remain within the intended scope of the invention as defined in the claims.

The invention claimed is:

1. A current control circuit for a power converter to control the switching thereof, the current control circuit comprising:
    a digital controller using a logical error signal to produce a logical control signal with a fixed fundamental frequency for the power converter; and
    a current measurement device for measuring a current in the power converter,
    wherein the current control circuit is configured to compare the current in the power converter to a current reference to determine the logical error signal, and wherein the logical error signal causes a generation of the logical control signal from the digital controller,
    wherein the digital controller is configured to control the power converter so the current in the power converter has a profile comprising a rising slope and a falling slope within a single clock period, and is configured to attempt to center the falling slope on the current reference.

2. The current control circuit of claim 1, wherein the logical error signal is determined by a comparator.

3. The current control circuit of claim 1, wherein the current control circuit further comprises a digital to analogue converter or a pulse width modulated interface to convert a digital current reference to the current reference.

4. The current control circuit of claim 3, wherein the digital current reference is received from an external source.

5. The current control circuit of claim 1, wherein the digital controller is arranged to generate said logical control signal with a timing calculated from the timing of previous transitions of said logical error signal.

6. The current control circuit of claim 1, wherein the digital controller includes at least one of a field programmable gate array or a microprocessor.

7. A power converter having a current control circuit according to claim 1.

8. The power converter of claim 7, wherein the power converter is adapted to receive the logical control signal and respond thereto by closing or opening one or more switches.

9. An uninterruptible power supply unit comprising a power converter according to claim 7.

10. The current control circuit of claim 1, wherein the digital controller is configured to store a first time interval, the first time interval being between a first time defined by a regular clock edge and a second time defined by a crossing of the rising slope and the current reference, and configured to determine a second time interval based on the first time interval, the clock period, and a crossing factor, and configured to produce the logical control signal to cause the current in the power converter to transition from a rising slope to a falling slope at the second time interval after the second time.

11. The current control circuit of claim 10, wherein the crossing factor is determined from a ratio of the second time interval and a third time interval as measured in a preceding clock cycle, the third time interval being delineated by the end of the second time interval and a subsequent time defined by a crossing of the falling slope and the current reference.

12. The current control circuit of claim 1, wherein the digital controller is configured to cause the current in the power converter to transition from the falling slope to the rising slope on a regular clock edge.

13. A method of controlling the switching of a power converter comprising:
    measuring the current in the power converter to determine a measured current;
    comparing the measured current with a reference current to determine a logical current error signal; and
    using the logical current error signal to cause a logical control signal with a fixed fundamental frequency to be generated from a digital controller to thereby control the switching of the power converter so the current in the power converter has a profile comprising a rising slope and a falling slope within a single clock period, and is generated to attempt to center the falling slope on the current reference.

14. The method of claim 13, further comprising determining the logical current error signal using a comparator.

15. The method of claim 13, further comprising converting a digital reference current to an analogue reference current to generate the reference current.

16. The method of claim 13, further comprising generating the logical control signal for the power converter to open and close one or more switches.

17. The method of claim 13, wherein said logical control signal is generated with a timing calculated from the timing of previous transitions of said logical current error signal.

18. The method of claim 13, wherein the digital controller is a digital component such as a field programmable gate array or a microprocessor.

19. A current control circuit for a power converter to control the switching thereof, the current control circuit comprising:
    a current measurement device for measuring a current in the power converter, wherein the current control circuit is configured to compare the current in the power converter to a current reference to determine a logical error signal; and a digital controller using the logical error signal to produce a logical control signal with a fixed fundamental frequency for the power converter, wherein the digital controller is configured to:

control the power converter so a current in the power converter has a profile comprising a rising slope and a falling slope within a single clock period, store a first time interval, the first time interval being between a first time defined by a regular clock edge and a second time defined by a crossing of the rising slope and the current reference, determine a second time interval based on the first time interval, the clock period, and a crossing factor, and produce the logical control signal to cause the current in the power converter to transition from a rising slope to a falling slope at the second time interval after the second time.

20. The current control circuit of claim 19, wherein the crossing factor is determined from a ratio of the second time interval and a third time interval as measured in a preceding clock cycle, the third time interval being delineated by the end of the second time interval and a subsequent time defined by a crossing of the falling slope and the current reference.

21. The current control circuit of claim 19, wherein the digital controller is configured to cause the current in the power converter to transition from the falling slope to the rising slope on a regular clock edge.

* * * * *